(12) United States Patent
Ludwig et al.

(10) Patent No.: US 6,828,873 B2
(45) Date of Patent: Dec. 7, 2004

(54) INTEGRATED HIGH FREQUENCY CIRCUIT FOR AFFECTING THE AMPLITUDE OF SIGNALS

(75) Inventors: Michael Ludwig, Erbach (DE); Rolf Reber, Ulm (DE)

(73) Assignee: EADS Deutschland GmbH, Munich (DE)

( * ) Notice: Subject to any disclaimer, the term of this patent is extended or adjusted under 35 U.S.C. 154(b) by 0 days.

(21) Appl. No.: 10/179,022

(22) Filed: Jun. 26, 2002

(65) Prior Publication Data

US 2003/0016093 A1 Jan. 23, 2003

(30) Foreign Application Priority Data

Jun. 26, 2001 (DE) .......................................... 101 30 764

(51) Int. Cl.[7] .............................. H03L 5/00; H04B 1/06; H04B 7/00
(52) U.S. Cl. .................. 333/81 R; 327/308; 455/249.1
(58) Field of Search ............................ 333/81 R, 81 A, 333/25, 156, 174; 327/308; 330/284; 455/249.1

(56) References Cited

U.S. PATENT DOCUMENTS

| | | | | |
|---|---|---|---|---|
| 3,924,206 A | * | 12/1975 | Fassett ...................... | 333/81 R |
| 4,654,610 A | * | 3/1987 | Dasilva ..................... | 333/81 R |
| 4,707,639 A | * | 11/1987 | Truskalo .................... | 315/382 |
| 4,890,077 A | * | 12/1989 | Sun .......................... | 333/81 A |
| 4,970,478 A | * | 11/1990 | Townley ..................... | 333/81 R |
| 4,996,504 A | | 2/1991 | Huber et al. | |
| 5,049,841 A | * | 9/1991 | Cooper et al. ............ | 333/81 R |
| 5,109,204 A | * | 4/1992 | Keefer ...................... | 333/81 A |
| 5,233,317 A | * | 8/1993 | Snodgrass et al. ........ | 333/81 A |
| 5,345,123 A | * | 9/1994 | Staudinger et al. ......... | 327/308 |
| 5,416,451 A | * | 5/1995 | Kaltenecker et al. ......... | 333/25 |
| 5,483,191 A | | 1/1996 | Blodgett | |
| 5,502,421 A | * | 3/1996 | Nakahara .................. | 333/81 R |
| 5,563,557 A | * | 10/1996 | Sasaki ...................... | 333/81 R |
| 5,565,823 A | * | 10/1996 | Fratti ....................... | 333/81 R |
| 5,796,286 A | | 8/1998 | Otaka | |
| 5,912,599 A | | 6/1999 | Beall | |
| 5,920,241 A | * | 7/1999 | Mazzochette ............... | 333/174 |
| 6,266,001 B1 | * | 7/2001 | Fang et al. ................. | 341/144 |
| 6,271,727 B1 | * | 8/2001 | Schmukler .................. | 330/284 |
| 6,400,237 B1 | * | 6/2002 | Seino ........................ | 333/156 |
| 6,414,565 B1 | * | 7/2002 | Tanaka et al. ............ | 333/81 A |
| 6,420,923 B1 | * | 7/2002 | Balasubramaniyan ....... | 327/308 |
| 6,448,866 B1 | * | 9/2002 | Watanabe ................. | 333/81 R |
| 6,480,708 B1 | * | 11/2002 | Tanaka et al. ........... | 455/249.1 |
| 6,489,856 B1 | * | 12/2002 | Weigand ................... | 333/81 R |

FOREIGN PATENT DOCUMENTS

| | | |
|---|---|---|
| DE | 4230252 | 3/1994 |
| DE | 19608966 | 9/1997 |
| DE | 19708207 | 9/1997 |
| EP | 0360916 | 2/1991 |
| EP | 0741452 | 11/1996 |
| JP | 11145777 | 5/1999 |

OTHER PUBLICATIONS

European Search Report mailed Dec. 22, 2003.
Horng Jye Sun, et al., "Single Voltage Attenuator" Applied Microwave, Fall 1990.
S.T. Janesch, et al., "0.25 um PHEMT X Band Multifunction LNA MMIC with T/R Switch and Attenuator Achieves 1.85 dB Noise Figure" IEEE MTT–S Digest, 1992.

* cited by examiner

*Primary Examiner*—Patrick Wamsley
(74) *Attorney, Agent, or Firm*—Crowell & Moring LLP

(57) ABSTRACT

The invention relates to an integrated HF circuit with attenuators, exhibiting an input, an output, and a number of field effect transistors as switching elements with a number of positive supply voltages, wherein the attenuators control, according to an attenuation state, which can be switched between two states, the amplitude of a reference signal, applied to the input, and produces an actual signal at the output. According to the invention, the attenuators exhibit a number of inductors and/or capacitors for phase compensation, and the field effect transistors may be driven without power.

25 Claims, 4 Drawing Sheets

INTEGRATED HIGH FREQUENCY CIRCUIT FOR AFFECTING THE AMPLITUDE OF SIGNALS

CROSS REFERENCE TO RELATED APPLICATIONS

This application claims the priority of Application No. 101 30 764.3, filed Jun. 26, 2001, in Germany, the disclosure of which is expressly incorporated by reference herein.

FIELD OF THE INVENTION

The invention relates to an integrated high frequency ("HF") circuit with attenuators for setting the amplitude of a reference signal, fed to the HF circuit, into an actual signal, generated in the HF circuit.

BACKGROUND OF THE INVENTION

In the conventional integrated high frequency circuits, whose purpose is to affect the amplitude of signals and which have, in particular, MESFET-based (metal semiconductor field effect transistor) or HEMT-based (high electron mobility transistor) switching elements, there are undesired phase variations of the signals. It is known to compensate for these undesired phase variations by using expensive circuits and algorithms. Such an integrated HF circuit, wherein the amplitude of the signals is affected by using non-compensated attenuators, is described in the article by Brian Bedard, "Fast GaAs MMIC Attenuator has 5-b Resolution," Microwaves & RF, October 1991, pages 71–76. In patent document EP 0 360 916 A1, another attenuator without phase compensation is described.

In addition, conventional HF circuits need negative control voltages in order to set the respective operating states. Of course, the digital logic circuits, with which the HF circuits are driven, work with positive voltages. This factor is a drawback to the extent that the conventional HF circuits require two supply voltages. For this reason, additional interfaces, e.g., level converters, are required between the HF circuit and the digital logic circuit. There are also other drawbacks with respect to the space requirement on a microchip in which the HF circuit is integrated. Other drawbacks include the longer switching time, the high current consumption, and the high manufacturing costs.

In U.S. Pat. No. 5,796,286, an attenuator with two states of attenuation is described. The switching between the attenuation states is done by using field effect transistors (FETs), which can be switched into a conducting state and a blocking state. The FETs are driven by using a constant current source supplied by a positive supply voltage. The drawback of this method is a high current consumption by the attenuator. Other drawbacks are the high manufacturing costs and the large amount of space required by the attenuator.

SUMMARY OF THE INVENTION

An object of the invention is to provide an integrated HF circuit for affecting the amplitude of signals. The integrated HF circuit is phase compensated and can reduce the space requirement, the switching time, and the manufacturing costs of such an HF circuit on a microchip.

This object is addressed by the features of the integrated HF circuit with attenuators, exhibiting an input (E), an output (A) and field effect transistors, wherein the attenuators control, according to an attenuation state, which can be switched between two states, the amplitude of a reference signal applied to the input E and produce an actual signal at the output A. Advantageous designs of the HF circuit are presented herein.

According to one aspect of the present invention, the attenuators utilize inductors and/or capacitors for phase compensation. In addition, the field effect transistors may be driven without power. The advantage is that, in contrast to the prior art, there is no need for an additional interface between the digital logic circuit and the HF circuit. Thus, the switching time of the HF circuit of the invention may be significantly reduced. Further, the HF circuit of the invention requires less space on a microchip, thus reducing the manufacturing costs. Another advantage is that the integrated HF circuit of the invention may require only one supply voltage. Yet another advantage according to the invention is that since the field effect transistors in the attenuators may be driven without power, no current is consumed.

With the integrated HF circuit of the invention, the amplitude is set in fixed steps by using attenuators connected in series, preferably one after the other. The attenuators may be switched advantageously into the respective states, both with little loss (attenuation) and with defined loss. In this respect, the advantage is that a defined adjustment of the signal power or the signal amplitude can be achieved in several steps. For example, if all of the attenuators are switched into a state with minimum loss, the signal amplitude of the actual signal is the maximum.

In the individual attenuators, the inductors and/or the capacitors are wired together advantageously in such a manner that an undesired phase change of the reference signal, the signal to be affected is compensated for in the attenuator. Without additional measures, the passage phase of an individual attenuator is a function of the state of the circuit (little loss or defined loss). During changeover in the attenuator, the reference signal (the signal to be affected) experiences not only a change in amplitude, but also an undesired change in phase. The capacitors and/or inductors present in the HF circuit of the invention bring about additional phase changes, opposing the undesired phase changes and thus compensate for them.

The attenuators preferably exhibit attenuations of 0.5 dB, 1 dB, 2 dB, 4 dB, 8 dB, 16 dB. However, arbitrary binary division is also possible, e.g., 0.75 dB, 1.5 dB, 3 dB, 6 dB, etc., or 0.45 dB, 0.9 dB, 1.8 dB, 3.6 dB, 7.2 dB, etc. In addition, non-binary division can also be used, e.g., 0.71 dB, 1.27 dB, 2.26 dB, 4 dB, 7.2 dB, etc.

In particular, field effect transistors, which may be put into a conducting and blocking states by using an input voltage (also called gate voltage), serve as the switching elements. However, bipolar transistors may also be used that can be put into a conducting state when driven with small base currents. According to the invention, these switching elements have a positive supply voltage. This feature may be realized in particular by providing the attenuators with a positive voltage. The switching elements may be driven advantageously by using a positive digital level, in particular a TTL or CMOS level.

The order in which the individual attenuators are connected depends on the system considerations and hence may vary. Thus, it is possible in an advantageous design of the invention that additional stages of amplification are inserted between the attenuators. The stages of amplification cause the individual attenuators to uncouple and, thus, enable the undisturbed addition of individual states of attenuation in the respective attenuators. In addition, the stages of amplification have an advantageous impact on the noise factor and the drivability (compression point) of the integrated HF circuit.

To obtain an HF circuit with a low noise factor in an HF circuit, the attenuators having low attenuation values, e.g., 0.5 dB, 1 dB, 2 dB, may be interconnected between a first and a second amplifier, and attenuators having higher attenuation values can be connected behind the second amplifier.

The integrated HF circuit of the invention may be used in all applications in which the amplitude of the signals has to be affected, e.g., transmit receive ("T/R") modules, controllable receivers, and modulators for communications. In particular, the HF circuit of the invention may be implemented with integrated technology, e.g., GaAs HEMT technology.

Other advantages of the integrated HF circuit of the invention include the simplification of the calibration expense in the transmit and receive case in active phased-array T/R modules. In addition, the actuation expense inside the module may be simplified.

Other objects, advantages, and novel features of the present invention will become apparent from the following detailed description of the invention when considered in conjunction with the accompanying drawings.

DETAILED DESCRIPTION OF THE DRAWINGS

Figure 1:
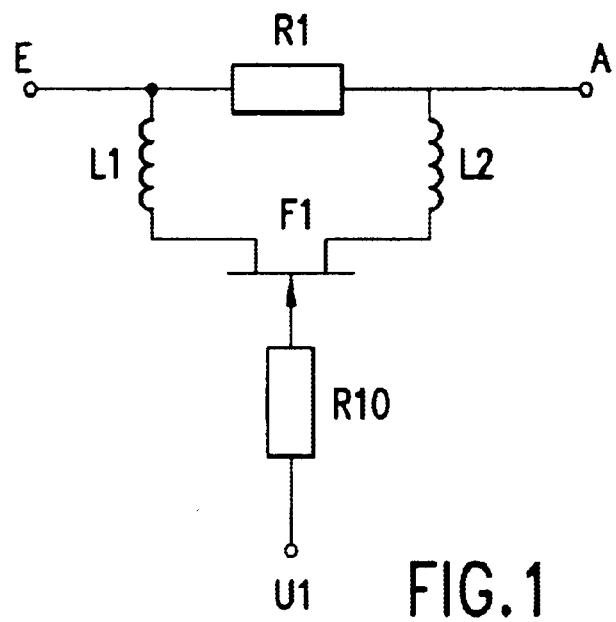
FIG. 1 depicts an embodiment of an inventive HF circuit for an attenuator having an attenuation value of 0.5 dB.

FIG. 1 depicts an embodiment of an inventive HF circuit for an attenuator having an attenuation value of 0.5 dB. The reference signal E is fed to the HF circuit at the junction of the resistor R1 and the inductor L1. The actual signal A is taken from the HF circuit at the junction of the resistor R1 and the inductor L2. The two inductors L1, L2 are connected to outputs of the transistor F1. The HF circuit is supplied with the voltage U1 via the input of the transistor F1 through resistor R10.

In the state of minimum attenuation, the transistor F1 is conductive, i.e., there is a positive voltage at the input. If the voltage U1 is approximately 0V at the input of the transistor F1, then the reference signal E is attenuated. In this respect, the attenuation is done by using the resistor R1. The inductors L1 and L2 serve to compensate the phase. Depending on the value of the inductors, the inductors may be realized as spiral coils or line segments, e.g., microstrip lines.

Figure 2:
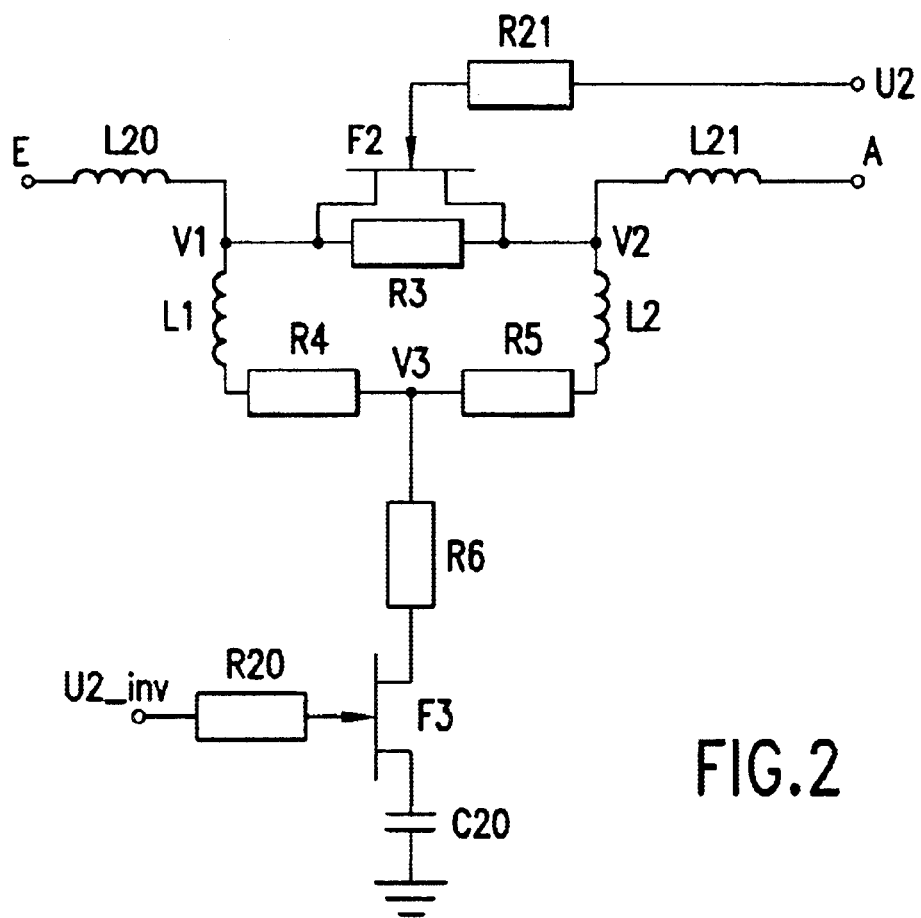
FIG. 2 depicts an embodiment of an inventive HF circuit for an attenuator having attenuation values of 1 dB, 2 dB or 4 dB.

FIG. 2 depicts an embodiment of an inventive HF circuit for an attenuator with an attenuation value of 1 dB, 2 dB, or 4 dB. Depending on the attenuation value, the values of the inductors and capacitors must be matched.

The reference signal E is fed into the HF circuit via an inductor L20 for improved matching purposes to the junction V1 of resistor R3, the inductor L1, and an output of the transistor F2. The other output of the transistor F2 is connected to the junction V2 of the resistor R3 and the inductor L2. The actual signal A is taken from the HF circuit via an inductor L21, which is connected to the junction V2 and which serves for improved matching purposes. At the input of the transistor F2, the voltage U2 is applied by way of a resistor R21.

The two inductors L1 and L2 are connected together by way of the resistors R4 and R5 at the junction V3. An output of the transistor F3 is connected to the junction V3 by way of the resistor R6. The other output of the transistor F3 is connected to ground by way of a capacitor C20. At the input of the transistor F3, the voltage U2_inv is applied by way of a resistor R20, where the voltage U2_inv is the voltage inverted in relation to U2. This means, the voltage U2_inv is positive, because the voltage U2=0V and vice versa.

In the state of minimum attenuation, the transistor F2 is conductive, i.e., at the input of the transistor F2, a positive voltage is applied. Since the voltage at the input of the transistor F3 is precisely the inverse of the voltage applied at the transistor F2, the transistor F3 is blocked.

Attenuation occurs when the voltage conditions at the inputs to F2 and F3 are inverse. That is, F3 is conductive (applied voltage U2_inv is positive) and F2 blocks (applied voltage is 0V). Thus, the reference signal E is attenuated by using resistors R3, R4, R5, and R6. The inductors L1 and L2 serve for phase compensation purposes.

Figure 3:
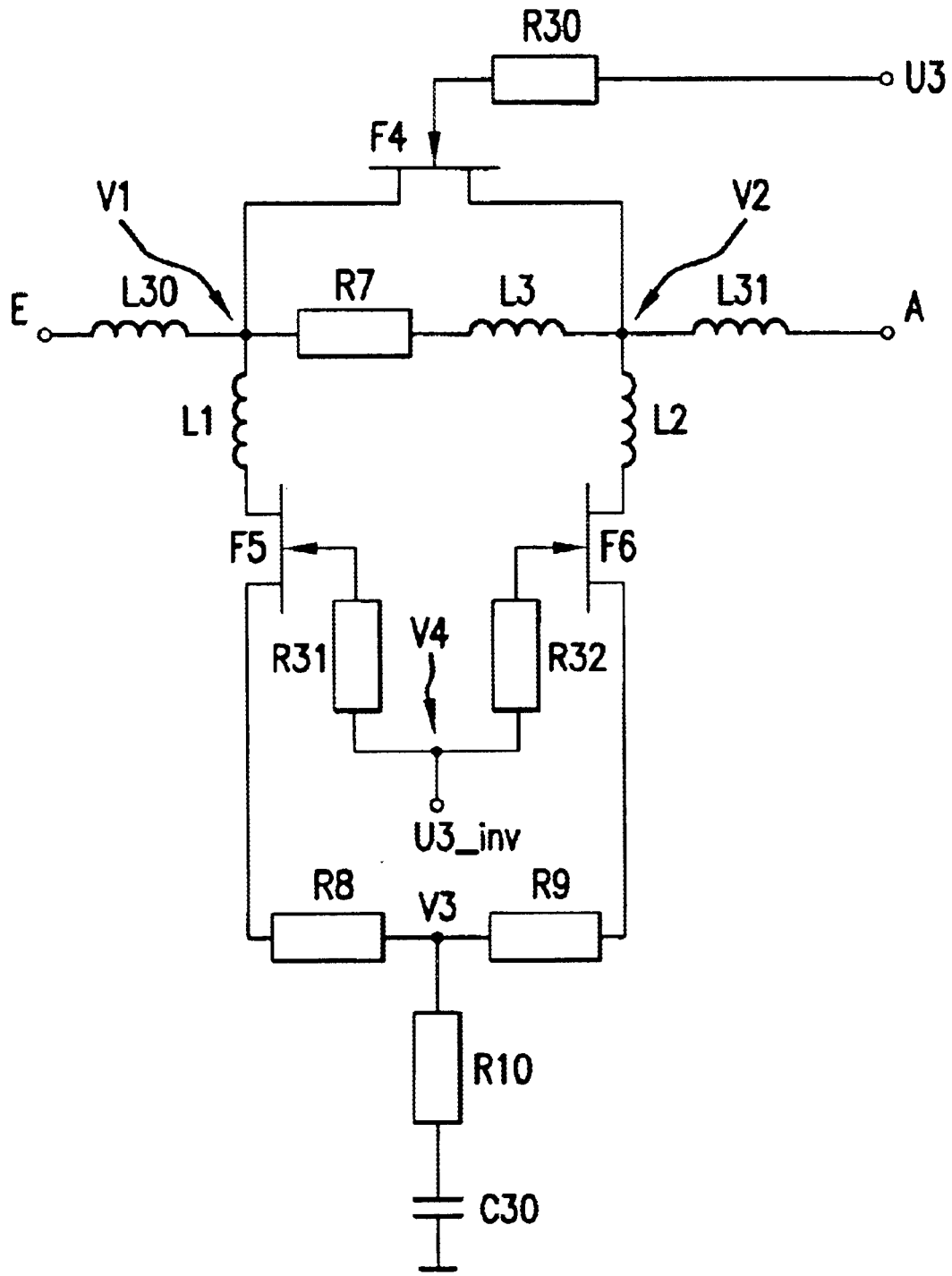
FIG. 3 depicts an embodiment of an inventive HF circuit for an attenuator having an attenuation value of 8 dB.

FIG. 3 depicts an embodiment of an inventive HF circuit for an attenuator having an attenuation value of 8 dB. The reference signal E is fed into the HF circuit by way of an inductor L30 at the junction V1 of the resistor R7, an output of the transistor F4, and the inductor L1. Furthermore, the resistor R7 is connected to the inductor L3. The other output of the transistor F4 is connected to the junction V2 of the inductor L2 and the inductor L3. The actual signal A is taken from the junction V2 by way of another inductor L31 in order to improve the matching of the HF circuit.

The inductor L1 is connected to an output of the transistor F5. The other output of the transistor F5 is connected to the resistor R8. The inductor L2 is connected to an output of the transistor F6. The other output of the transistor F6 is connected to the resistor R9, which in turn is connected to the resistor R8 at the junction V3. This junction V3 is connected to ground by way of the resistor R10 and a capacitor C30.

At the inputs of the transistors F5 and F6, respectively, the voltage U3_inv is applied by way of resistors R31 and R32, respectively. The voltage U3 is applied at the input of the transistor F4 by way of resistor R30. The state of minimum attenuation is reached when the transistor F4 is conductive, i.e., when the voltage U3 is positive. At the same time, the transistors F5 and F6 block because here the voltage U3_inv=0V is applied. If the voltage U3=0V is applied at the input of the transistor F4, then the transistor F4 blocks, and an attenuation is accomplished by way of the resistors R7, R8, R9, and R10. At the same time, a positive voltage is applied at the transistors F5 and F6 owing to the inverse voltage. The coils L1, L2, and L3 serve for phase compensation purposes.

Figure 4:
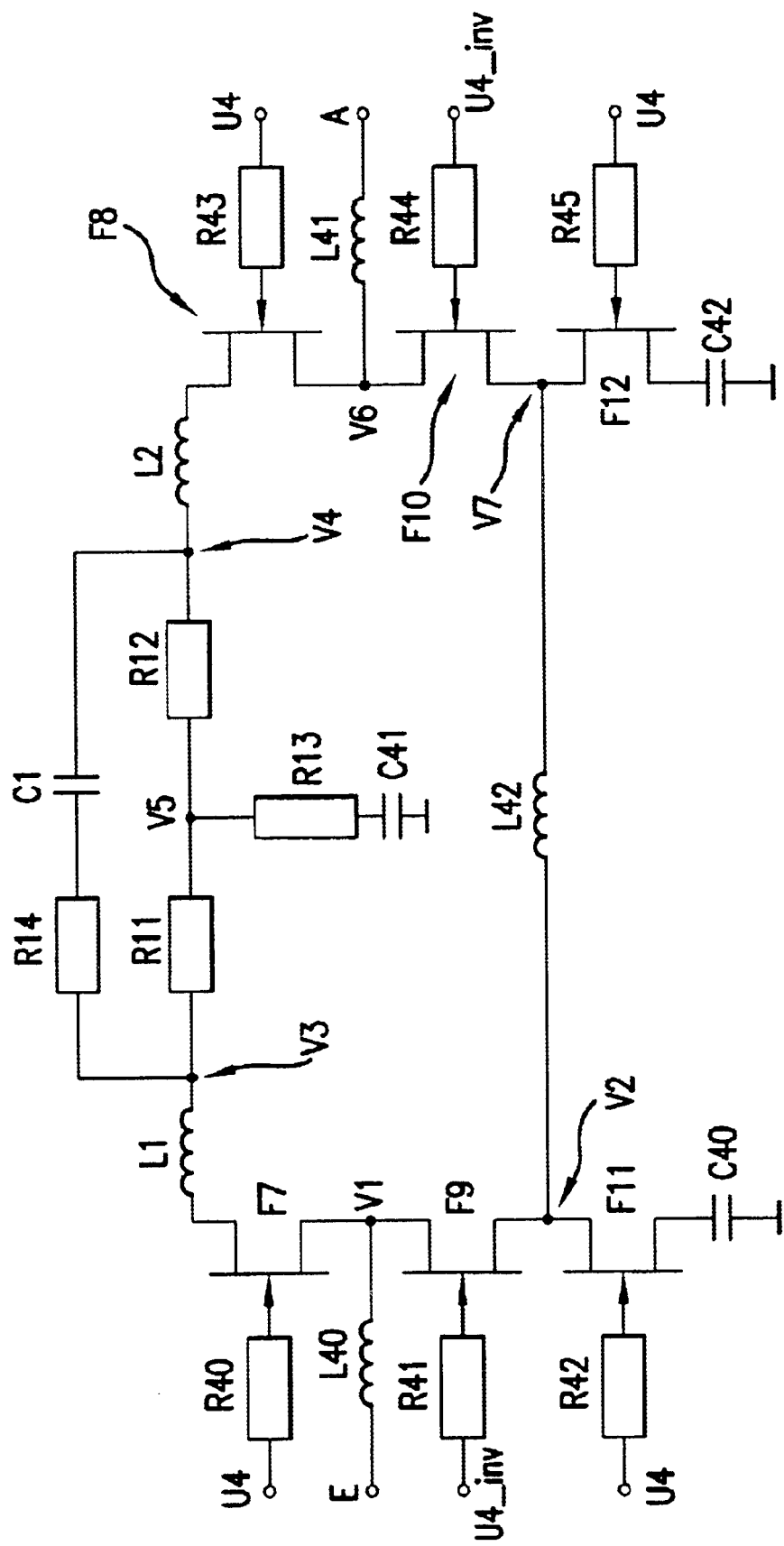
FIG. 4 depicts an embodiment of an inventive HF circuit for an attenuator having an attenuation value of 16 dB.

FIG. 4 depicts an embodiment of an inventive HF circuit for an attenuator having an attenuation value of 16 dB. An output of the transistor F7 and an output of the transistor F9 are connected together at junction V1. The reference signal E is fed into the HF circuit at the junction point V1 by way of an inductor L40 for improved matching purposes. At the junction V2 the other output of the transistor F9 is connected to an output of the transistor F11, whose other output is attached to ground by way of a capacitor C40.

The other output of the transistor F7 is connected to the resistor R14 by way of an inductor L1 at the junction V3 with the resistor R1. The resistor R14 is connected to the resistor R12 by way of the capacitor C1 at the junction V4. The resistors R12 and R11 are connected together at the junction V5. The junction V5 is attached to ground by way of the resistor R13 and a capacitor C41.

An output of the transistor F8 is attached to the junction V4 by way of an inductor L2. The other output of the transistor F8 is connected to an output of the transistor F10 by way of the junction V6. The actual signal A is taken from the junction V6 by way of an inductor L41 for improved matching purposes. The other output of the transistor F10 is connected by way of the junction V7 to an output of the transistor F12, whose other output is attached to ground by way of a capacitor C42.

The two junctions V2 and V7 are connected together by way of an inductor L42.

At the inputs of the transistors F7, F8, F11, and F12, the voltage U4 is applied by way of resistors R40, R43, R42, and R45, respectively. The voltage U4_inv is applied to the inputs of the transistors F9 and F10 by way of resistors R41 and R44, respectively.

If the voltage U4_inv is positive, then the transistors F9 and F10 are conductive and there is minimum attenuation. Simultaneously, the transistors F7, F8, F11, F12 block because here the voltage U4=0V is applied.

The HF circuit is switched in the attenuating state when the voltage U4_inv=0V. In this case, the transistors F9 and F10 block, and attenuation ensues by way of the resistors R11, R12, R13, and R14. At the same time, a positive voltage is applied to the transistors F7, F8, F11, F12, for which reason these transistors are conductive. The inductors L1 and L2 and the capacitor C1 serve for phase compensation purposes.

Of course, the inputs for the reference signal E and the outputs for the actual signal A may be exchanged in the described HF circuits.

Figure 5:
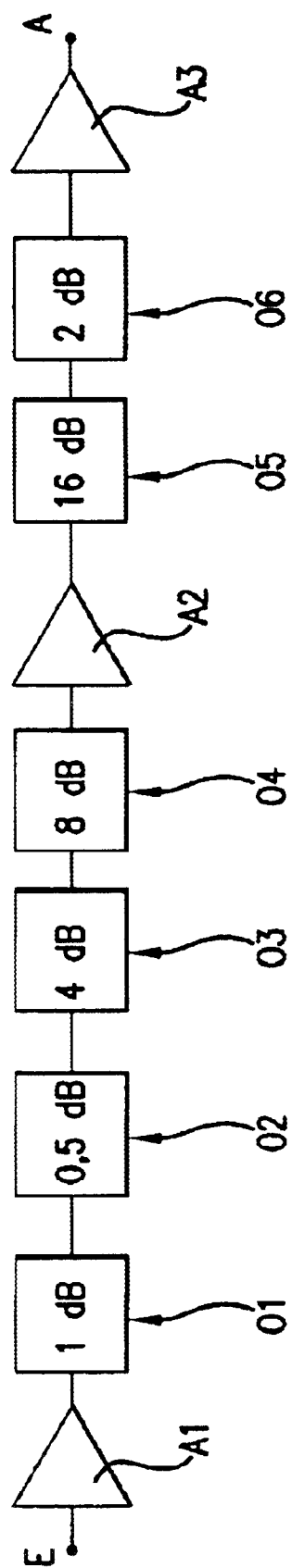
FIG. 5 depicts an exemplary combination of the inventive attenuators having different attenuation values.

FIG. 5 depicts an exemplary combination of the inventive attenuators having different attenuation values. In this respect, the reference signal E is fed to an amplifier A1. The signal is then fed to an attenuator D1 having an attenuation value of 1 dB, and signal flows into an attenuator D2 having an attenuation value of 0.5 dB. From there the signal is fed to an attenuator D3 having 4 dB, to which an attenuator D4 having 8 dB is connected in outgoing circuit. The latter is connected in series to another amplifier A2. The amplifier A2 is followed by an attenuator D5 having 16 dB, to which an attenuator D6 having 2 dB is connected in series. The latter attenuator is connected in series to a third amplifier A3 from whose output the actual signal A is taken.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An integrated HF circuit with attenuators, exhibiting an input, an output and field effect transistors as switching elements with positive supply voltages, wherein the attenuators control, according to an attenuation state, which can be switched between two states, the amplitude of a reference signal applied to the input and produces an actual signal at the output, wherein the attenuators exhibit at least one of inductors and capacitors for phase compensation and wherein the field effect transistors can be driven without power.

2. The integrated HF circuit of claim 1, wherein the attenuators are connected in series.

3. The integrated HF circuit of claim 2, wherein the attenuators can be switched into a state with little loss and defined loss.

4. The integrated HF circuit of claim 1, wherein said at least one of inductors and capacitors are connected together in such a manner that a phase change of the reference signal in an attenuator can be compensated for.

5. The integrated HF circuit of claim 1, wherein the attenuators exhibit attenuations of 0.5 dB, 1 dB, 2 dB, 4 dB, 8 dB, and 16 dB.

6. The integrated HF circuit of claim 1, wherein additional stages of amplification can be interconnected between the attenuators.

7. The integrated HF circuit of claim 1, wherein the switching elements can be driven by means of a positive digital level, in particular a TTL or CMOS level.

8. An integrated HF circuit with an input and an output, comprising:
    a plurality of attenuators; and
    at least one switching element, wherein said at least one switching element is a field effect transistor, and wherein said at least one switching element has at least one positive supply voltage;
    wherein said plurality of attenuators control, according to an attenuation state, said output based on said input, wherein said attenuation state is switchable between a first state and a second state,
    wherein said plurality of attenuators perform phase compensation with at least one capacitor or at least one inductor or with said at least one capacitor and said at least one inductor, and
    wherein said at least one switching element is driven without power.

9. The integrated HF circuit of claim 8, wherein said plurality of attenuators are connected in series.

10. The integrated HF circuit of claim 9, wherein said plurality of attenuators are switched into a state, wherein said state has little loss or has defined loss or has said little loss and said defined loss.

11. The integrated HF circuit of claim 8, wherein said at least one capacitor and said at least one inductor are connected together in such a manner that a phase change of the input can be compensated for.

12. The integrated HF circuit of claim 8, wherein said attenuators have attenuations of 0.5 dB, 1 dB, 2 dB, 4 dB, 8 dB, and 16 dB.

13. The integrated HF circuit of claim 8, wherein additional states of amplification are interconnected between a first of said plurality of attenuators and a second of said plurality of attenuators.

14. The integrated HF circuit of claim 8, wherein said at least one switching element is driven by a positive digital level, wherein said positive digital level is a TTL or CMOS level.

15. A circuit, comprising:
    a first terminal;
    a second terminal;
    at least one attenuator; and
    at least one switching element;
    wherein said at least one switching element is connected between said first terminal and said second terminal, and wherein said at least one attenuator is connected between said first terminal and said second terminal, wherein said at least one attenuator controls an input signal applied to said first terminal to produce an output signal generated at said second terminal, wherein said at least one switching element comprises at least one transistor, and wherein said at least one transistor comprises at least one bipolar transistor.

16. A circuit, comprising:

a first terminal;

a second terminal;

at least one attenuator; and at least one switching element;

wherein said at least one switching element is connected between said first terminal and said second terminal, and wherein said at least one attenuator is connected between said first terminal and said second terminal, wherein said at least one attenuator controls an input signal applied to said first terminal to produce an output signal generated at said second terminal, and wherein said at least one attenuator comprises at least one capacitor.

17. The circuit of claim 16, wherein said at least one capacitor performs phase compensation.

18. A circuit, comprising:

a first terminal;

a second terminal;

at least one attenuator; and at least one switching element;

wherein said at least one switching element is connected between said first terminal and said second terminal, and wherein said at least one attenuator is connected between said first terminal and said second terminal, wherein said at least one attenuator controls an input signal applied to said first terminal to produce an output signal generated at said second terminal, and wherein said at least one attenuator comprises at least one inductor.

19. The circuit of claim 18, wherein said at least one inductor performs phase compensation.

20. A circuit, comprising:

a first terminal;

a second terminal;

at least one attenuator; and at least one switching element;

wherein said at least one switching element is connected between said first terminal and said second terminal, and wherein said at least one attenuator is connected between said first terminal and said second terminal, wherein said at least one attenuator controls an input signal applied to said first terminal to produce an output signal generated at said second terminal, and wherein said at least one attenuator comprises at least one inductor and at least one capacitor.

21. The circuit of claim 20, wherein said at least one inductor and said at least one capacitor perform phase compensation.

22. A circuit, comprising:

a first terminal;

a second terminal;

at least one attenuator; and at least one switching element;

wherein said at least one switching element is connected between said first terminal and said second terminal, and wherein said at least one attenuator is connected between said first terminal and said second terminal, wherein said at least one attenuator controls an input signal applied to said first terminal to produce an output signal generated at said second terminal, and wherein said at least one switching element is driven without power.

23. A circuit, comprising:

a first terminal;

a second terminal;

at least one attenuator; and at least one switching element;

wherein said at least one switching element is connected between said first terminal and said second terminal, and wherein said at least one attenuator is connected between said first terminal and said second terminal, wherein said at least one attenuator controls an input signal applied to said first terminal to produce an output signal generated at said second terminal, and wherein said at least one switching element is drivable by a positive digital level.

24. The circuit of claim 23, wherein said positive digital level is a TTL level.

25. The circuit of claim 23, wherein said positive digital level is a CMOS level.

* * * * *